(12) United States Patent
Wei et al.

(10) Patent No.: US 7,144,774 B1
(45) Date of Patent: Dec. 5, 2006

(54) METHOD OF FABRICATING NON-VOLATILE MEMORY

(75) Inventors: Houng-Chi Wei, Hsinchu (TW); Saysamone Pittikoun, Hsinchu County (TW)

(73) Assignee: Powerchip Semiconductor Corp., Hsinchu (TW)

(*) Notice: Subject to any disclaimer, the term of this patent is extended or adjusted under 35 U.S.C. 154(b) by 0 days.

(21) Appl. No.: 11/162,082

(22) Filed: Aug. 29, 2005

(51) Int. Cl.
*H01L 21/8247* (2006.01)
(52) U.S. Cl. ...................... 438/257; 438/954
(58) Field of Classification Search ........ 438/257–267, 438/954
See application file for complete search history.

(56) References Cited

U.S. PATENT DOCUMENTS 5,330,924 A * 7/1994 Huang et al. ............... 438/258
6,008,087 A * 12/1999 Wu .............................. 438/257

* cited by examiner

*Primary Examiner*—Richard A. Booth
(74) *Attorney, Agent, or Firm*—Jianq Chyun IP Office

(57) ABSTRACT

A method of fabricating a non-volatile memory includes providing a substrate having a composite dielectric layer, a sacrificial layer and a mask layer sequentially formed thereon. The mask layer is patterned to form a plurality of first openings for exposing a portion of the sacrificial layer. The sacrificial layer exposed by the first openings is removed and a plurality of first gates is formed in the first openings. The mask layer is further removed to form a plurality of second openings between the first gates. An insulating layer is formed on the tops and sidewalls of the first gates. A portion of the sacrificial layer exposed by the second openings is removed and a plurality of second gates is formed in the second openings. The second gates and the first gates embody a memory cell column. Source/region regions are formed in the substrate beside the memory cell column.

26 Claims, 8 Drawing Sheets

METHOD OF FABRICATING NON-VOLATILE MEMORY

BACKGROUND OF THE INVENTION

1. Field of the Invention

The present invention relates to a semiconductor memory device. More particularly, the present invention relates to a fabrication method of a non-volatile memory.

2. Description of Related Art

In the various types of non-volatile memory, electrically erasable programmable read only memory (EEPROM) allows multiple data reading, writing and erasing operations. In addition, the stored data are retained even after power to the device is removed. With these advantages, electrically erasable programmable read only memories have been broadly applied in personal computers and electronic equipment.

The industry provides a type of non-volatile memory as shown in FIG. 1. This non-volatile memory is constituted with a plurality of memory cells 102 and a plurality of memory cells 116. The memory cells 102 and the memory cells 116 are isolated from each other with the spacers 110. Each memory cell 102 is formed, sequentially from the substrate 100, a bottom dielectric layer 104a, a charge-storage layer 104b and a top dielectric layer 104c (the bottom dielectric layer 104a, the charge-storage layer 104b and the top dielectric layer 104c constitute a composite dielectric layer 104), a gate 106 and a cap layer 108. Each memory cell 116 is disposed between two memory cells 102. Moreover, each memory cell 116 is formed, sequentially from the substrate 100, a bottom dielectric layer 112a, a charge-storage layer 112b and a top dielectric layer 112c (the bottom dielectric layer 112a, the charge—storage layer 112b and the top dielectric layer 112c constitute a composite dielectric layer 112) and a gate 114. No gap is present between each memory cell of this type of non-volatile memory. Accordingly, the level of integration can be increased.

However, during the fabrication process of the above non-volatile memory, the composite dielectric layer 104 of the memory cells 102 and the composite dielectric layer 112 of the memory cells 116 are formed in different process steps. As a result, the fabrication process is complicated. Moreover, since each memory cell 116 is formed between two memory cells 102, the composite dielectric layer 112 of the memory cells 116 is formed on a nonplanar surface. The thickness of the composite dielectric layer is not uniformed due to the corners formed between the memory cells 102 and the substrate 100. Consequently, the reliability of the memory cells is less desirable. Ultimately, the electrical characteristics between the memory cells 102 and the memory cells 116 are not consistent, greatly affecting the efficiency of the device.

SUMMARY OF THE INVENTION

Accordingly, the present invention provides a fabrication method for a non-volatile memory device, wherein composite dielectric layers with the same properties are concurrently formed to raise the reliability of the memory cells.

The present invention further provides a fabrication method for a non-volatile memory device, in which the thermal budget can be lowered to raise the efficiency of the device. Moreover, the process is simpler to lower the manufacturing cost.

The present invention provides a fabrication method for a non-volatile memory device, and this method includes providing a substrate and forming a composite dielectric layer on the substrate. The composite dielectric layer includes a bottom dielectric layer, a charge-storage layer and a top dielectric layer. Thereafter, a sacrificial layer is formed over the composite dielectric layer, followed by forming a mask layer over the composite dielectric layer. The mask layer is then patterned to form a plurality of openings that expose the sacrificial layer. A plurality of first gates is then formed in the first opening. These first gates and the underlying composite dielectric layer constitute a plurality of first memory cells. The mask layer is further removed to form a plurality of second openings between the plurality of first gates. Thereafter, an insulation layer is formed at the tops and the sidewalls of the first gates. The portions of the sacrificial layer exposed by the second openings are further removed to form a plurality of second gates in the second openings. The second gates and the underlying composite dielectric layer form a plurality of second memory cells. The second memory cells and the first memory cells form a memory cell column. Source/drain regions are respectively formed beside the two sides of a memory cell column.

According to the fabrication method of a non-volatile memory of one embodiment of the present invention, the steps in forming the first gates in the first openings includes forming a first conductive layer over the substrate, followed by removing the first conductive layer outside the first openings to expose the mask layer.

According to the fabrication method of a non-volatile memory of one embodiment of the present invention, wherein the above-mentioned first conductive layer includes but not limited to doped polysilicon. Further, removing the portions of the first conductive layer outside the first openings includes performing a chemical mechanical polishing process.

According to the fabrication method of a non-volatile memory of one embodiment of the present invention, the material of the above-mentioned sacrificial layer includes silicon nitride. Further, the process steps in removing the portion of the sacrificial layer exposed by the first openings and the process steps in removing the portion of the sacrificial layer exposed by the second openings include an etching process using phosphoric acid as an etchant, for example.

According to the fabrication method of a non-volatile memory of one embodiment of the present invention, the material of the mask layer and the material of the sacrificial layer have different etching selectivities. Moreover, the sacrificial layer and the top dielectric layer also have different etching selectivities.

According to the fabrication method of a non-volatile memory of one embodiment of the present invention, the material of the above-mentioned mask layer includes silicon oxide.

According to the fabrication method of a non-volatile memory of one embodiment of the present invention, the step of forming the second gates in the second openings includes forming a second conductive layer over the substrate, followed by removing a portion of the second conductive layer outside second openings to expose the insulation layer at the tops of the first gates.

According to the fabrication method of a non-volatile memory of one embodiment of the present invention, the above mentioned second conductive layer includes doped polysilicon. Removing the second conductive layer outside the second openings includes performing chemical mechanical polishing.

According to the fabrication method of a non-volatile memory of one embodiment of the present invention, the method of forming the insulation layer at the tops and the sidewalls of the first gates includes thermal oxidation.

According to the fabrication method of a non-volatile memory of one embodiment of the present invention, the materials of the above bottom dielectric layer and the top dielectric layer include silicon oxide, and the material of the charge-storage layer includes silicon nitride.

The present invention provides a fabrication method for a non-volatile flash memory, the method includes providing a substrate. A composite dielectric layer is then formed over the substrate. The composite dielectric layer includes a bottom dielectric layer, a charge-storage layer and a top dielectric layer. A mask layer is then formed over the composite dielectric layer. Then, the mask layer is patterned to form a plurality of first openings that expose the composite dielectric layer. A plurality of first gates is formed in these first openings. The mask layer is subsequently removed to form a plurality of second openings between the first gates. An insulation layer is formed at the top parts and the sidewalls of the first gates, followed by forming a plurality of second gates in the second openings. These second gates and the underlying composite layer form a plurality of second memory cells. The second memory cells and the first memory cells form a memory column. Thereafter, source/drain regions are respectively formed in the substrate beside both sides of the memory cell column.

According to the fabrication method of a non-volatile memory of one embodiment of the present invention, the step of forming the first gates in the first openings includes, for example, forming a first conductive layer over the substrate, followed by removing a portion of the first conductive layer outside the first openings to expose the mask layer.

According to the fabrication method of a non-volatile memory of one embodiment of the present invention, the step of forming the second gates in the second openings includes forming a second conductive layer over the substrate, followed by removing a portion of the second conductive layer to expose the insulation layer at the tops of the first gates.

According to the fabrication method of a non-volatile memory of one embodiment of the present invention, the material of the first conductive layer includes doped polysilicon, while the material of the second conductive layer may also include doped polysilicon. The method used in removing the first conductive layer outside the first openings and the second conductive layer outside the second openings includes but not limited to chemical mechanical polishing.

According to the fabrication method of a non-volatile memory of one embodiment of the present invention, the method used in forming the insulation layer at the tops and the sidewalls of the first gates includes thermal oxidation.

According to the fabrication method of a non-volatile memory of one embodiment of the present invention, the materials of the bottom dielectric layer and the top dielectric layer include silicon oxide, while the material of the charge-storage layer includes silicon nitride.

Since all the composite dielectric layers of the memory cell column are concurrently formed on a planarized surface, the deposition of composite dielectric layer on a non-planarized surface as in the prior art, leading the problems of poor reliability of the memory cell, can be obviated.

Further, since the composite dielectric layer is formed once, the thermal budge can be lowered to raise the efficiency of the device. Moreover, the manufacturing process of the invention is simpler and the cost is lowered.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 2A through 2G are schematic cross-sectional views showing the steps for fabricating a non-volatile memory according to one embodiment of the present invention.

Figure 1:
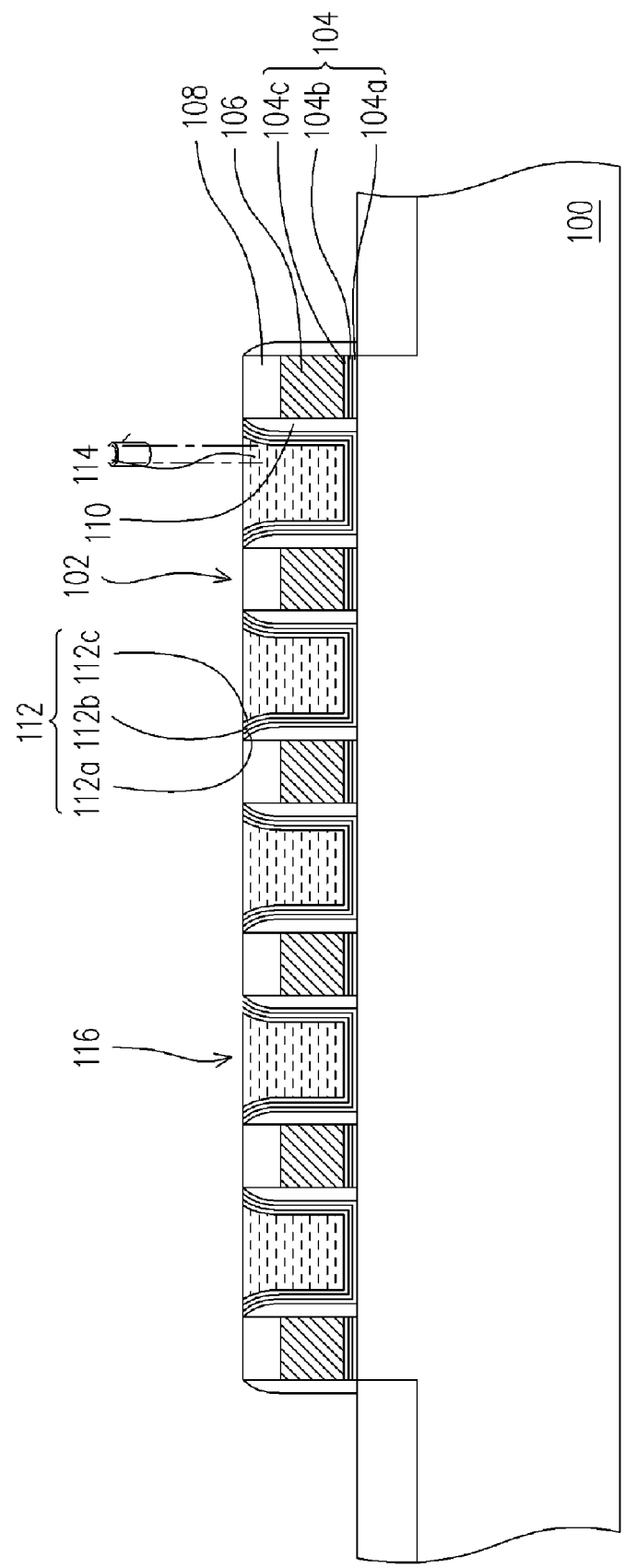
FIG. 1 is a schematic, cross-sectional view diagram of a non-volatile memory.
Figure 2A:
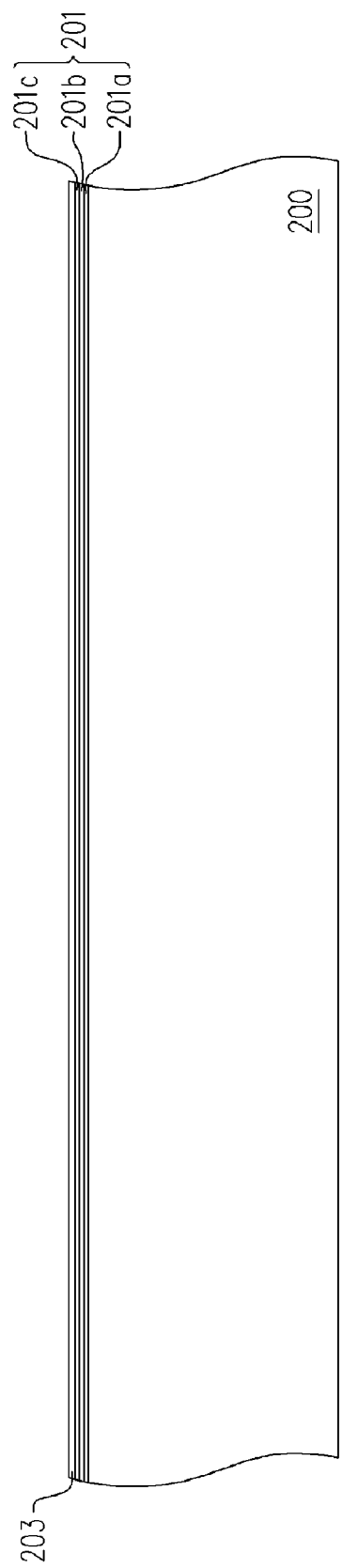
FIGS. 2A through 2G are schematic cross-sectional views showing the steps for fabricating a non-volatile memory according to one embodiment of the present invention.

Referring to FIG. 2A, the method of the invention includes providing a substrate 200, and the substrate is a silicon substrate, for example. A composite dielectric layer 201 is formed over the substrate 200, wherein the composite dielectric layer 201 is formed with, sequentially from the substrate 200, a bottom dielectric layer 201a, a charge-storage layer 201b and a top dielectric layer 201c, for example. The bottom dielectric layer 201a is formed with a material including silicon oxide by chemical vapor deposition, for example. The bottom dielectric layer 201a and the top dielectric layer can form with similar materials. The material of the charge-storage layer 201b is not limited to silicon nitride; it can be other materials, for example, tantalum oxide, strontium titanate or hafnium oxide, etc, that can trap charges or doped polysilicon.

A sacrificial layer 203 is formed over the composite dielectric layer 201. The material of the sacrificial layer 203 and the material of the top dielectric layer 201c have different etching selectivities. The material of the sacrificial layer 203 includes but not limited to silicon nitride, and the sacrificial layer 203 is formed by chemical vapor deposition.

Figure 2B:
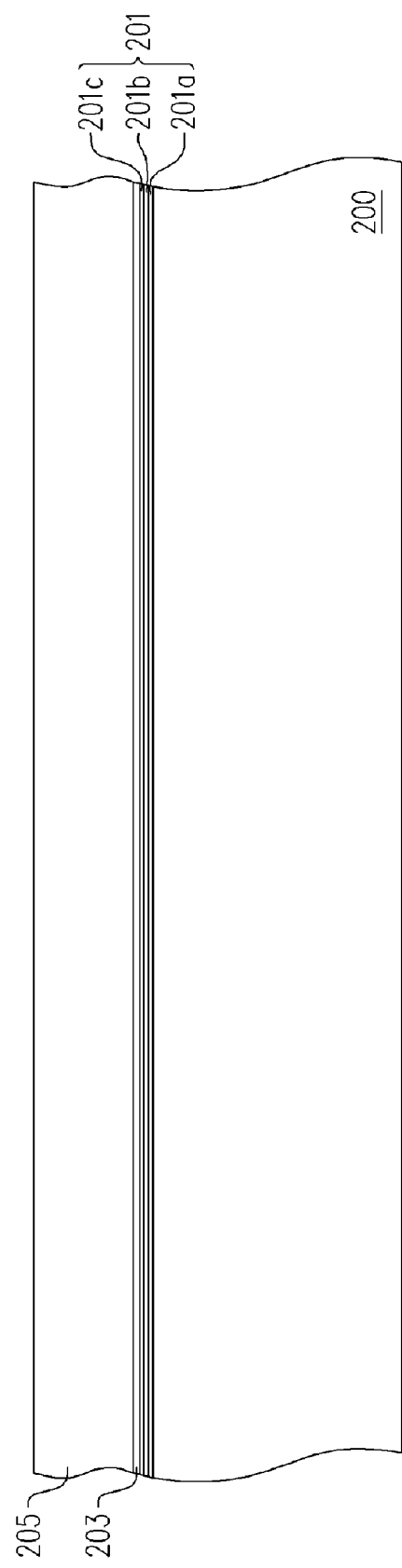

Thereafter, referring to FIG. 2B, a mask layer 205 is formed over the sacrificial layer 203. The material of the mask layer 205 and the material of the sacrificial layer 203 have different etching selectivities. The material of the mask layer 205 includes silicon oxide, and the mask layer 205 is formed by chemical vapor deposition, for example.

Figure 2C:
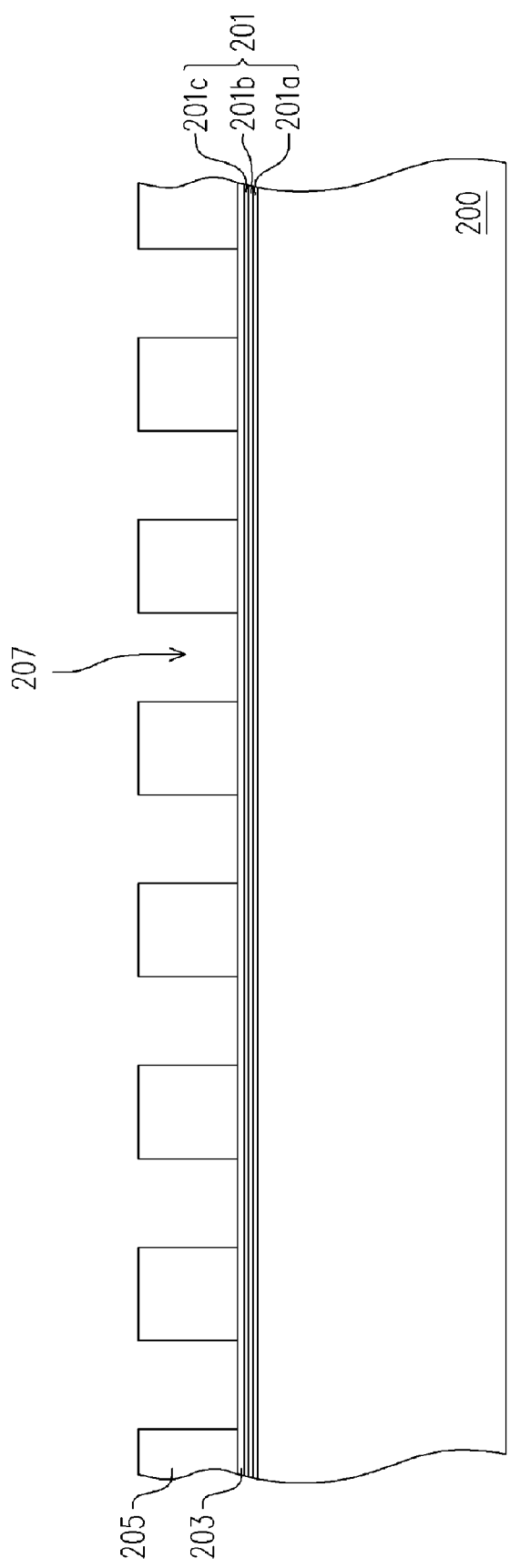

Referring to FIG. 2C, the mask layer 205 is patterned to form a plurality of openings 208 that expose the sacrificial layer 203. Patterning the mask layer 205 is completed by photolithography and etching processes.

Figure 2D:
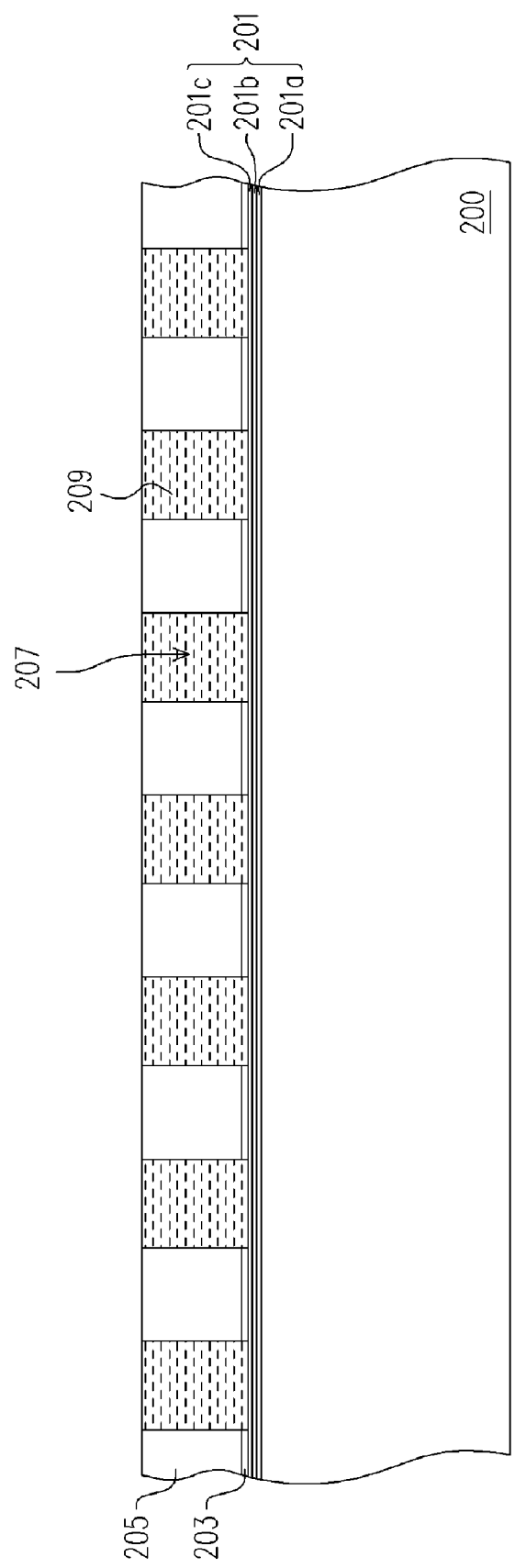

Referring to FIG. 2D, the sacrificial layer 203 exposed by these openings 207 is removed. The sacrificial layer 203 is removed by, for example, performing a wet etching process using phosphoric acid as an etchant. Since the material of the sacrificial layer 203 and the material of the top dielectric layer have different etching selectivity, the top dielectric layer is prevented from being etched when the portion of the sacrificial layer 203 is removed. The reliability of the composite dielectric layer is thereby maintained. The composite dielectric layer 201 underneath the mask layer 205 is covered by the mask layer 205 and is thus prevented from being etched.

Continuing with FIG. 2D, a plurality of gates 209 is formed in the openings 207. The gates 209 are formed by, for example, forming a conductive layer (not shown) over the substrate, followed by removing the conductive layer outside the openings 207 to expose the mask layer 205. The material of the conductive layer includes doped polysilicon, for example. The conductive layer is formed by, for example, forming a layer of undoped polysilicon layer using chemical vapor deposition and performing an ion implantation. The doped polysilicon layer can also form by in-situ doping in combination with chemical vapor deposition. Removing the conductive layer outside the openings 207 includes performing chemical mechanical polishing.

Figure 2E:
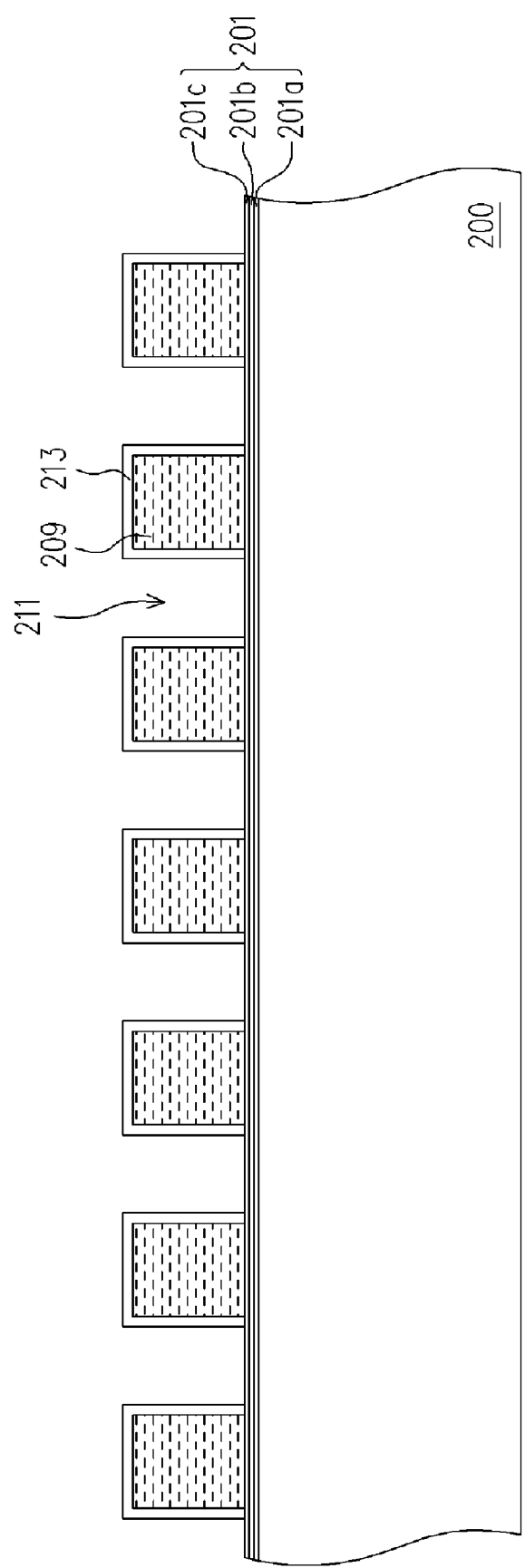

Referring to FIG. 2E, the mask layer 205 is removed to form a plurality of openings 211 between the gates 209. Removing the mask layer 205 includes performing dry etching or wet etching. Since the etching selectivities of the material of the mask layer 205 and the material of the sacrificial layer 203 are different, the etching is stopped at the sacrificial layer 203, and any etching of the top dielectric layer is thus prevented. An insulation layer 213 is then formed at the tops and the sidewalls of these gates 209. The material of the insulation layer 213 includes silicon oxide, and the insulation layer 213 is formed by, for example, thermal oxidation.

A portion of the sacrificial layer 203 exposed by the openings 211 is then removed to expose the composite dielectric layer 201. The step of removing the portion of the sacrificial layer 203 exposed by these openings 211 includes performing a wet etching process, for example, using phosphoric acid as an etchant. Since the material of the sacrificial layer and the material of the top dielectric layer have different etching selectivities, the top dielectric layer 201c is prevented from being etched when a portion of the sacrificial layer 203 is removed to maintain the integrity of the composite dielectric layer 201.

Figure 2F:
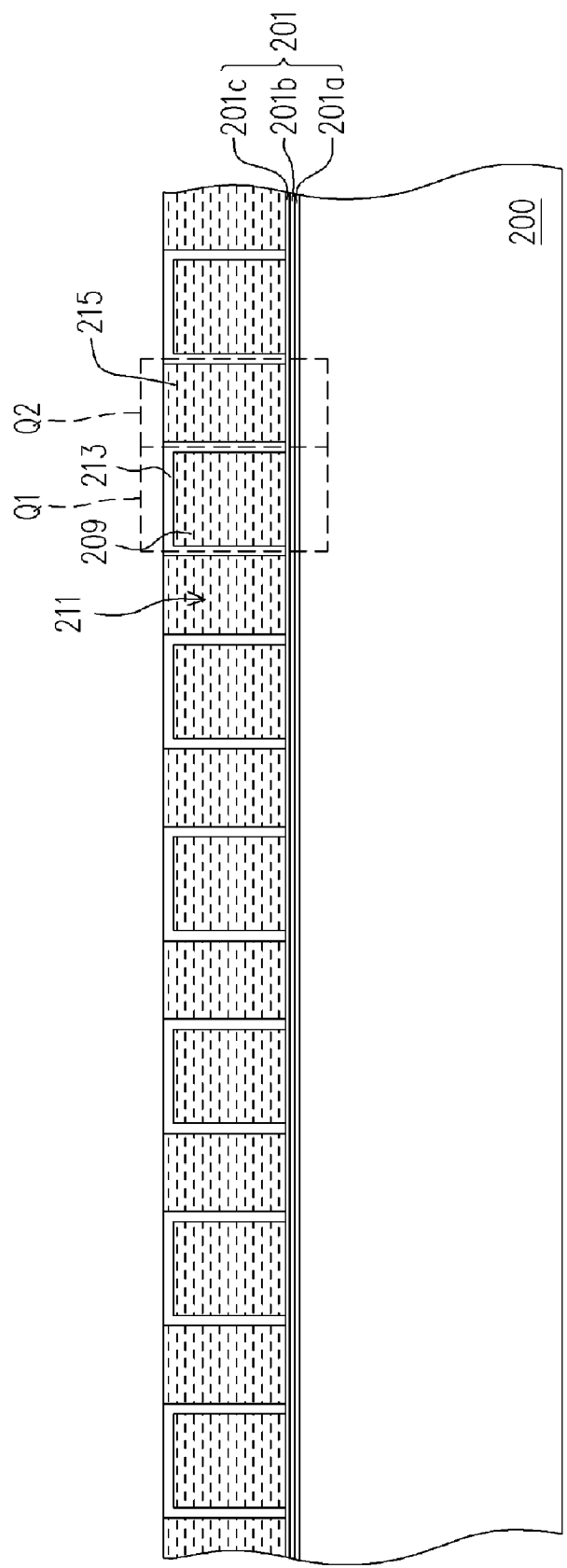

As shown in FIG. 2F, a plurality of gates 215 is formed in the openings 211. The gates 215 are formed by, for example, forming a conductive layer (not shown) over the substrate 200, and removing a portion of the conductive layer outside the openings 211 to expose the insulation layer 213 at the top parts of the gates 209. The material of the conductive layer includes a doped polysilicon material, for example. The doped polysilicon layer is formed by, forming an un-doped polysilicon layer, followed by an ion implantation process. The doped polysilicon can also be formed by an in-situ doping method and chemical vapor deposition. Removing a portion of the conductive layer outside the openings 211 includes performing chemical mechanical polishing.

The gate 209 and the underlying composite dielectric layer 201 form memory cell Q1, while the gate 215 and the underlying composite dielectric layer 201 form the memory cell Q2. A plurality of the memory cells Q1 and a plurality of the memory cells Q2 embody a memory cell column.

Figure 2G:
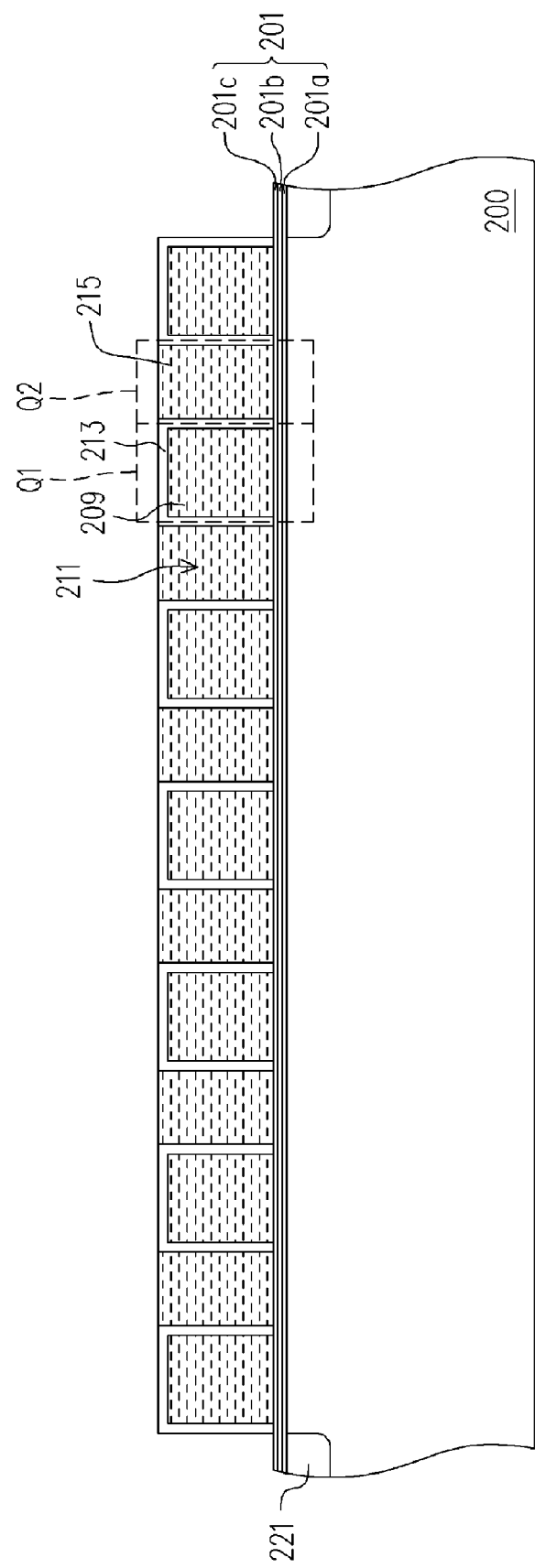

Continuing to FIG. 2G, the residual gates 215 above the areas pre-determined for the source/drain regions are removed. The residual gates 215 are removed by performing an etching process, for example. The source/drain regions 221 are then formed in the substrate 200 beside both sides of the memory cell column. The source/drain regions 221 are formed by ion implantation, for example. The implanted dopants include P-type ions or N-type ions, depending on the type of device desired to be formed.

It is worth to note that, a sacrificial layer 203 is formed above the composite dielectric layer 201 as an example for the above embodiment. Although the sacrificial layer 203 provides the function of protecting the composite dielectric layer 201 underneath the sacrificial layer 203. The disposition of the sacrificial layer 203 can be selective in view of the actual demands. If the sacrificial layer 203 is selected not to be formed, the mask layer 205 can form directly on the top dielectric layer 201c as long as the silicon nitride material or other material selected for the mask layer 205 has a different etching selectivity from that of the top dielectric layer. As a result, after the mask layer 205 is removed, the top dielectric layer 201c is retained to maintain the quality of the composite dielectric layer 201.

It is appreciated that the application of the technique introduced here is not restricted in the fabrication of six memory cells. It is understood by a person of ordinary skill practicing this invention that number of memory cells fabricated in accordance with the present invention for a memory cell row may vary according to the actual demands. For example, same bit lint can connect 32 to 64 memory cell structures. Further, the fabrication method for a non-volatile memory of the present invention is applied to the fabrication of the entire memory cell column.

Accordingly, the composite dielectric layer 201 is formed on a planar surface in a same process step. The required thermal budget for the process is thus reduced to enhance the efficiency of the device, to simplify the process flow and to lower the manufacturing cost. Further, the composite dielectric layer 201 of the memory cells Q1 and Q2 is formed on a planar surface. The film quality is thus more stable to ensure consistent electrical characteristics between the memory cell Q1 and the memory cell Q2 to raise the reliability of the device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a non-volatile memory, the method comprising:
   providing a substrate;
   forming a composite dielectric layer over the substrate, the composite dielectric layer comprising a bottom dielectric layer, a charge-storage layer and a top dielectric layer;
   forming a sacrificial layer over the composite dielectric layer;
   forming a mask layer over the sacrificial layer;
   patterning the mask layer to form a plurality of openings that expose the sacrificial layer;
   removing a portion of the sacrificial layer exposed by the first openings;
   forming a plurality of first gates in the first openings, wherein the first gates and the composite dielectric layer underneath the first gates form a plurality of first memory cells;
   removing the mask layer to form a plurality of second openings between the first gates;
   removing the sacrificial layer exposed by the second openings;

forming an insulation layer at tops and sidewalls of the first gates;

forming a plurality of second gates in the second openings, wherein the second gates and the composite dielectric layer underneath the second gates form a plurality of second memory cells, and the second memory cells and the first memory cells form a memory cell column; and forming a source/drain region in the substrate beside two sides of the memory cell column.

2. The method of claim 1, wherein the step of forming the first gates in the first opening further comprises:

forming a first conductive layer over the substrate; and removing a part of the first conductive layer outside the first openings to expose the mask layer.

3. The method of claim 2, wherein a material of the first conductive layer includes doped polysilicon.

4. The method of claim 2, wherein the step of removing the part of the first conductive layer outside the first openings comprises performing a chemical mechanical polishing process.

5. The method of claim 1, wherein a material used in forming the sacrificial layer comprises silicon nitride.

6. The method of claim 1, wherein the step of removing the portion of the sacrificial layer exposed by the first openings and the step of removing the portion of the sacrificial layer exposed by the second openings comprise performing a wet etching process.

7. The method of claim 6, wherein the wet etching process comprises using phosphoric acid as an etchant.

8. The method of claim 1, wherein an etching selectivity of a material of the mask layer is different from an etching selectivity of a material of the sacrificial layer, and the mask layer and the top dielectric layer have different etching selectivities.

9. The method of claim 1, wherein a material constituting the mask layer comprises silicon oxide.

10. The method of claim 1, wherein the step in forming the second gates in the second openings comprises:

forming a second conductive layer over the substrate; and removing a portion of the second conductive layer outside the second openings to expose the insulation layer at the tops of the first gates.

11. The method of claim 10, wherein a material constituting the second conductive layer comprises doped polysilicon.

12. The method of claim 11, wherein the step of removing the second conductive layer outside the second openings comprises conducting chemical mechanical polishing.

13. The method of claim 1, wherein the step of forming the insulation layer at the tops and the sidewalls of the first gates comprises performing a thermal oxidation.

14. The method of claim 1, wherein a material constituting the bottom dielectric layer and a material constituting the top dielectric layer comprises silicon oxide.

15. The method of claim 1, wherein a material constituting the charge-storage layer comprises silicon nitride or doped polysilicon.

16. A method for fabricating a non-volatile memory, the method comprising:

providing a substrate;

forming a composite dielectric layer over the substrate, the composite dielectric layer comprises a bottom dielectric layer, a charge-storage layer and a top dielectric layer;

forming a mask layer over the composite dielectric layer;

patterning the mask layer to form a plurality of openings that expose the composite dielectric layer;

forming a plurality of first gates in the first openings, the first gates and the composite dielectric layer underneath the first gates forming a plurality of memory cells;

removing the mask layer to form a plurality of second openings between the first gates;

forming an insulation layer on tops and sidewalls of the first gates;

forming a plurality of second gates in the second openings, wherein the second gates and the composite dielectric underneath the second gates embody a plurality of second memory cells, and the second memory cells and the first memory cells form a memory cell column; and forming a source/drain region in the substrate beside both sides of the memory cell column.

17. The method of claim 16, wherein the step of forming the first gates in the first openings comprises:

forming a first conductive layer over the substrate; and removing a portion of the first conductive layer outside the first openings to expose the mask layer.

18. The method of claim 17, wherein a material constituting the first conductive layer comprises doped polysilicon.

19. The method of claim 17, wherein the step of removing the first conductive layer outside the first openings includes conducting chemical mechanical polishing.

20. The method of claim 16, wherein the step of forming the second gates in the second openings comprises:

forming a second conductive layer over the substrate, and a material constituting the second conductive layer comprising polysilicon; and removing the portion of the second conductive layer outside the second openings to expose the insulation layer at the tops of the first gates.

21. The method of claim 20, wherein a material constituting the second conductive layer includes doped polysilicon.

22. The method of claim 20, wherein the step of removing the second conductive layer outside the second openings comprises conducting chemical mechanical polishing.

23. The method of claim 16, wherein the step of forming the insulation layer at the tops and the sidewalls of the first gates comprises a thermal oxidation method.

24. The method of claim 16, wherein a material constituting the bottom dielectric layer and a material constituting the top dielectric layer comprise silicon oxide.

25. The method of claim 16, wherein a material constituting the charge-storage layer comprises silicon nitride or doped polysilicon.

26. The method of claim 16, wherein a material constituting the charge-storage layer comprises doped polysilicon.

* * * * *